US008882069B2

(12) United States Patent
Mahaffey et al.

(10) Patent No.: US 8,882,069 B2
(45) Date of Patent: Nov. 11, 2014

(54) SECURING APPARATUS FOR PORTABLE ELECTRONIC DEVICES

(75) Inventors: Robert Mahaffey, Vancouver (CA); Will Ali, Vancouver (CA); John Tan, Vancouver (CA); John Hung, Vancouver (CA); Ryan White, Salem, MA (US); Wilson Tse, Vancouver (CA)

(73) Assignee: ACCO Brands Corporation, Lake Zurich, IL (US)

( * ) Notice: Subject to any disclaimer, the term of this patent is extended or adjusted under 35 U.S.C. 154(b) by 104 days.

(21) Appl. No.: 13/014,691

(22) Filed: Jan. 26, 2011

(65) Prior Publication Data

US 2011/0185776 A1 Aug. 4, 2011

Related U.S. Application Data

(60) Provisional application No. 61/299,814, filed on Jan. 29, 2010.

(51) Int. Cl.
*A47F 5/00* (2006.01)
*A47K 1/08* (2006.01)
(Continued)

(52) U.S. Cl.
CPC ......... *E05B 73/0082* (2013.01); *E05B 63/0056* (2013.01); *E05B 73/0005* (2013.01)
USPC .............. 248/310; 248/316.1; 248/316.2; 248/346.04; 248/346.06; 70/19; 70/58; 70/164

(58) Field of Classification Search
CPC .............. A47F 7/0246; E05B 73/0082; E05B 73/0005; A47G 25/0657; F16M 13/02; F16M 13/00; B60R 11/0241; B60R 2011/0071; F16B 2/12
USPC ................... 248/917, 919, 920, 924, 346.06, 248/346.07, 176.3, 220.21, 229.12, 229.14, 248/316.1, 316.4, 316.6, 551, 552, 553, 248/500, 506, 176.1; 70/51, 58, 14, 57, 70/209; 361/679.43, 679.27, 679.57

IPC ....................................................... F16M 11/00
See application file for complete search history.

(56) References Cited

U.S. PATENT DOCUMENTS 5,267,458 A * 12/1993 Heh ................................ 70/238
5,457,745 A * 10/1995 Wang ............................ 379/454
(Continued)

FOREIGN PATENT DOCUMENTS

KR   10-1998-0033391 A    7/1998
KR   10-1999-0065439       8/1999
(Continued)

OTHER PUBLICATIONS

The International Search Report of the International Searching Authority for Application No. PCT/US2011/022745, mailed on Sep. 30, 2011, 5 pages.

(Continued)

*Primary Examiner* — Jonathan Liu
*Assistant Examiner* — Muhammad Ijaz
(74) *Attorney, Agent, or Firm* — Michael Best & Friedrich LLP

(57) ABSTRACT

An apparatus for securing an electronic device includes a main body with two ends. An arm is provided at one end of the main body, and has a hook attached thereto, shaped for the electronic device to be placed between the hook and the arm. An additional arm is slidably attached to the other end of the main body, and is capable of being slid by a user to several lateral positions relative to the main body. An additional hook is provided on the slidable arm, and is shaped for the electronic device to be placed between the hook and the arm. A locking system is provided to lock and unlock the slidable arm to at least one of the lateral positions. A base section is capable of being secured at or near a location. The main body is adjustably attached to the base section.

10 Claims, 11 Drawing Sheets

(51) Int. Cl.
  *A47B 91/00*    (2006.01)
  *A47G 29/00*    (2006.01)
  *B65D 19/00*    (2006.01)
  *E05B 69/00*    (2006.01)
  *E05B 73/00*    (2006.01)
  *E05B 63/00*    (2006.01)

(56) References Cited

U.S. PATENT DOCUMENTS

| | | | | |
|---|---|---|---|---|
| 5,555,302 A | * | 9/1996 | Wang | 379/446 |
| 5,595,074 A | * | 1/1997 | Munro | 70/58 |
| RE35,677 E | * | 12/1997 | O'Neill | 248/551 |
| 5,836,183 A | * | 11/1998 | Derman | 70/58 |
| 5,903,645 A | * | 5/1999 | Tsay | 379/455 |
| 6,216,499 B1 | * | 4/2001 | Ronberg et al. | 70/58 |
| 7,007,912 B1 | * | 3/2006 | Giuliani et al. | 248/552 |
| 7,174,752 B2 | * | 2/2007 | Galant | 70/58 |
| 7,187,283 B2 | * | 3/2007 | Leyden et al. | 340/568.1 |
| D559,076 S | * | 1/2008 | Allen | D8/330 |
| 7,600,736 B2 | * | 10/2009 | Lee | 248/551 |
| 7,611,112 B2 | * | 11/2009 | Lin | 248/274.1 |
| 7,918,427 B2 | * | 4/2011 | Wang | 248/278.1 |
| 8,061,164 B2 | * | 11/2011 | Johnston et al. | 70/58 |
| 8,070,123 B2 | * | 12/2011 | Yu | 248/346.06 |
| 8,276,872 B2 | * | 10/2012 | Lampman et al. | 248/551 |
| 8,523,122 B2 | * | 9/2013 | Johnson et al. | 248/161 |
| 8,567,737 B2 | * | 10/2013 | Chen | 248/316.2 |
| 2007/0262223 A1 | * | 11/2007 | Wang et al. | 248/346.07 |
| 2009/0159769 A1 | * | 6/2009 | Lee | 248/310 |
| 2009/0294617 A1 | * | 12/2009 | Stacey et al. | 248/316.1 |
| 2010/0073857 A1 | * | 3/2010 | Lin et al. | 361/679.27 |
| 2010/0079285 A1 | * | 4/2010 | Fawcett et al. | 340/568.1 |
| 2011/0185774 A1 | * | 8/2011 | Tan et al. | 70/20 |
| 2012/0280101 A1 | * | 11/2012 | Bouverie et al. | 248/316.4 |
| 2012/0312936 A1 | * | 12/2012 | Huang | 248/122.1 |
| 2013/0043369 A1 | * | 2/2013 | Wheeler | 248/551 |

FOREIGN PATENT DOCUMENTS

| | | |
|---|---|---|
| KR | 20-0197836 Y1 | 9/2000 |
| KR | 10-2003-0060346 | 7/2003 |

OTHER PUBLICATIONS

The Written Opinion of the International Searching Authority for Application No. PCT/US2011/022745, mailed on Sep. 30, 2011, 3 pages.

* cited by examiner

SECURING APPARATUS FOR PORTABLE ELECTRONIC DEVICES

CROSS-REFERENCES TO RELATED APPLICATIONS

This application claims priority to provisional application 61/299,814, filed on Jan. 29, 2010, titled "Ratchet Dock," the disclosure of which is hereby incorporated by reference in its entirety for all purposes.

BACKGROUND

Several apparatuses have been developed to inhibit the theft of portable electronic devices, such as laptop computers. Some apparatuses are in the form of a lock and a cable securing a laptop computer at one end of the cable. The cable is attached to an immovable object at the other end. Some other apparatuses are in the form of mechanisms that secure a laptop computer using a retaining rod, or a clamp. Although such apparatuses can secure a laptop computer from theft, improvements can be made. For example, one, might try to separate the lock from the laptop computer. Although the laptop computer housing might be destroyed during this separation, a potential thief may be more intent on obtaining the data resident on the laptop computer than the computer itself. While a number of rigid securing apparatuses exist, such rigid designs do not allow for the movement of the laptop while it is secured. In some situations, for example, in a library or a store, there may be the need to allow users with different bodily dimensions (e.g., with different arm lengths) to use laptop computers The rigid designs of existing securing apparatuses can prevent different types of users from comfortably using such secured laptop computers, because they are fixed at a single position.

Embodiments of the invention address these and other problems, individually and collectively.

BRIEF SUMMARY

Embodiments of the invention include securing apparatuses, and methods of using securing apparatuses.

A first exemplary apparatus for securing an electronic device includes a main body capable of being disposed on a surface, and an arm coupled to the main body. The main body and the arm are shaped such that they can at least partially enclose the portable electronic device when the securing apparatus is locked. The securing apparatus is capable of being adjusted in at least three degrees of freedom when the portable electronic device is enclosed by and locked to the arm and the main body.

The apparatus may also include a base section capable of being disposed directly on the surface. The main body may be adjustably attached to the base section.

The adjustable attachment of the main body to the base section may include a pivotable attachment and/or a slidable attachment, such as a longitudinally and/or vertically slidable attachment. The adjustable attachment of the main body to the base section may be adjustable in at least three degrees of freedom, such as lateral movement, longitudinal movement, vertical movement, and/or rotational movement.

A second exemplary apparatus for securing an electronic device includes a main body with two ends. An arm is provided at one end of the main body, and has a hook attached thereto, shaped for the electronic device to be placed between the hook and the arm. An additional arm is slidably attached to the other end of the main body, and is capable of being slid by a user to several lateral positions relative to the main body. An additional hook is provided on the slidable arm, and is shaped for the electronic device to be placed between the hook and the arm. A locking system is further provided to lock and unlock the slidable arm to at least one of the lateral positions.

The first arm may also be slidable, and the apparatus may have an additional locking system to lock and unlock this arm. The apparatus may also have a base attached to the main body, for the electronic device to rest thereon. The apparatus may be capable of being permanently attached to a work surface. A cable may be attached to the apparatus, to be locked to an object. The main body may be adjustably attached to a base section, such as with a pivotable or slidable attachment, such as a longitudinally and/or vertically slidable attachment. The adjustable attachment may be adjustable in at least three degrees of freedom, such as lateral movement, longitudinal movement, vertical movement, and/or rotational movement.

An exemplary method of securing a portable electronic device to a securing apparatus is also provided. The securing apparatus includes a main body with a first end and a second end; a first arm, including a first hook, at the first end of the main body; a second arm, including a second hook, slidably disposed at the second end of the main body; and a locking system. The method includes placing a first portion of the electronic device between the first hook and the first arm; sliding the second arm with respect to the main body to a position at which a second portion of the electronic device is disposed between the second hook and the second arm; and locking the locking system to thereby secure the second arm to that position.

BRIEF DESCRIPTION OF THE DRAWINGS

Embodiments of the invention will be described with reference to the accompanying drawings, wherein like reference numerals indicate like elements, and wherein.

DETAILED DESCRIPTION OF EXEMPLARY EMBODIMENTS

One exemplary embodiment of a securing apparatus for securing a portable electronic device includes a main body configured to be disposed on a surface, and an arm coupled to the main body. The main body and the arm are capable of at least partially enclosing the portable electronic device when the apparatus is in a locked configuration. The apparatus is capable of being adjusted in three or more degrees of freedom when the portable electronic device is enclosed by and locked to the arm and the main body.

The portable electronic device may be, for example, a laptop computer, a monitor, a personal digital assistant, an electronic book reader, or a tablet computer.

The main body and the arm may be of any suitable sizes and shapes for the portable electronic device to be secured thereto. For example, if the portable electronic device is a laptop computer, the main body may be generally elongate with a length approximately equal to the width of a laptop computer, such as between about 200 mm and about 500 mm. The arm may be of any suitable configuration to at least partially enclose the device, such as an arm that is laterally slidable with respect to the main body, with a hook on an end thereof. The hook may be shaped to enclose a portion of the electronic device therein. For example, the hook may protrude longitudinally outward from the arm by between about 5 mm and about 50 mm, and laterally inward toward the main body by at least about 5 mm to thereby enclose a portion of the edge of the screen of the laptop between the hook and the arm.

The main body may be configured to be disposed directly on the surface, or may be placed on the surface via an intervening element such as a base member. The degrees of freedom may include longitudinal, vertical, and pivotable movement.

Exemplary embodiments of the above-described components and functionalities are described in further detail below, with reference to the accompanying drawings.

Securement of a Portable Electronic Device

Figure 1:
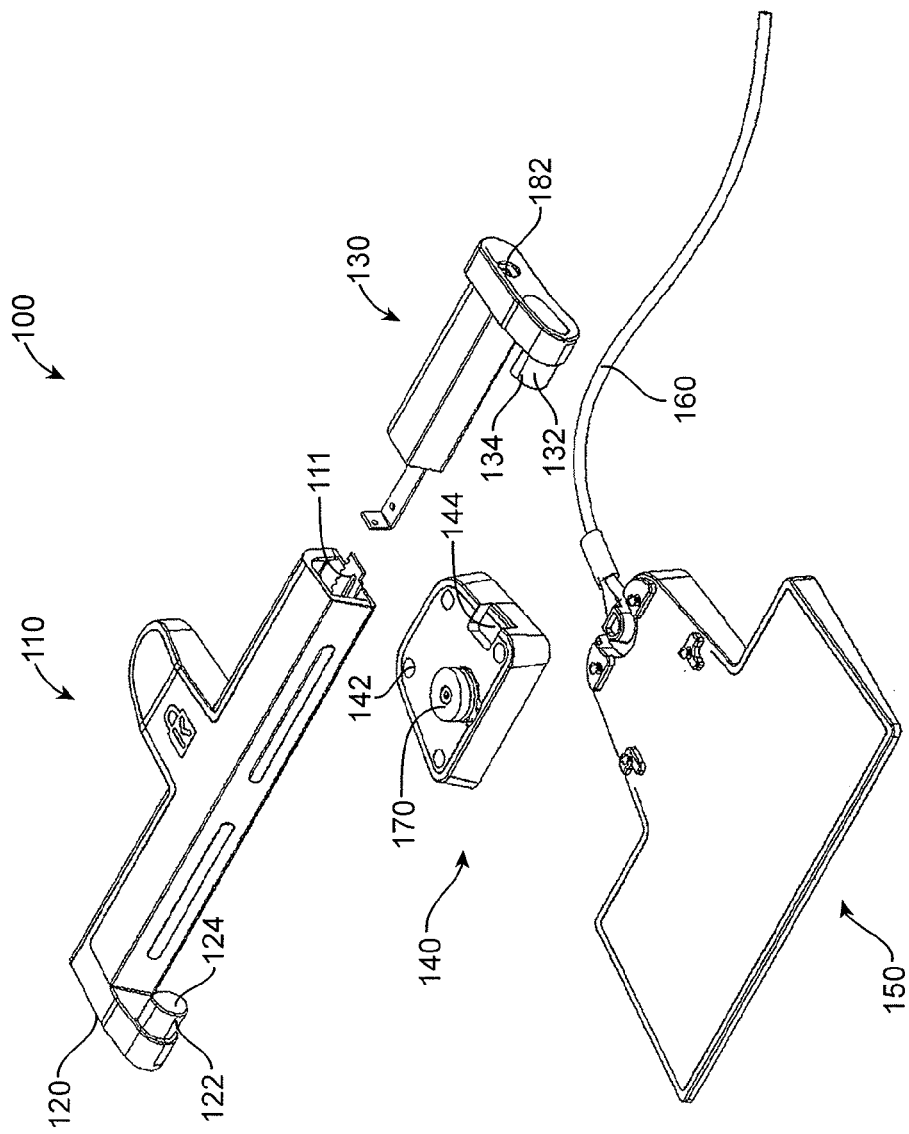
FIG. 1 is an exploded perspective view of an exemplary securing apparatus.

FIG. 1 is an exploded view of a securing apparatus 100 according to some exemplary embodiments of the invention. A main body 110 of generally elongate shape has two arms: a first arm 120 and a second arm 130, at its ends. The main body 110 and arms 120, 130 are shaped so that they can at least partially surround a portion of an electronic device (e.g. edges of a top, screen portion of a laptop computer) to thereby secure the electronic device. For example, in the embodiment illustrated in FIG. 1, each arm 120, 130 has a hook: a first hook 122, and a second hook 132, shaped in such a way that an electronic device can be placed between the hooks 122, 132 and the arms 120, 130. The hooks 122, 132 and the arms 120, 130 thus at least partially surround at least a portion of the electronic device. Exemplary electronic devices are laptop computers, monitors, personal digital assistants, electronic book readers, and tablet computers, but the invention is not limited thereto.

In some embodiments, at least one of the arms 120, 130 is a ratchet arm. For example, in the embodiment illustrated in FIG. 1, the second arm 130 is a ratchet arm, and is slidable with respect to the main body 110. In operation, referring also to FIG. 2, the second arm 130 can be slid outwards (diagonally down and to the right in FIGS. 1 and 2) by a user, so that the distance between the ends 124, 134 of the hooks 122, 132 is larger than the width of the electronic device 200 to be secured. The electronic device 200 is then placed between the hooks 122, 132, and slid back to abut the main body 110. The device 200 is then slid up and to the left in FIGS. 1 and 2 so that a portion of the device 200 is positioned between the hook 122 and the first arm 120. The second arm 130 is then manipulated to slide inwards with respect to the main body 110 (up and to the left in FIGS. 1 and 2) to decrease the distance between the hooks 122, 132, until another portion of the device 200 is positioned between the hook 132 and the second arm 130, to secure and at least partially enclose the electronic device 200 between the hooks 122, 132 and the arms 120, 130. The second arm 130 is then locked to this position, such as by the insertion and turning of a key (not shown) in a key hole 182, which engages a locking system 180 (not shown in FIG. 1 or 2) in the interior of the second arm 130 to block it to its position, so that the securing apparatus is in a locked configuration. Any suitable type of locking system can be used.

Figure 3:
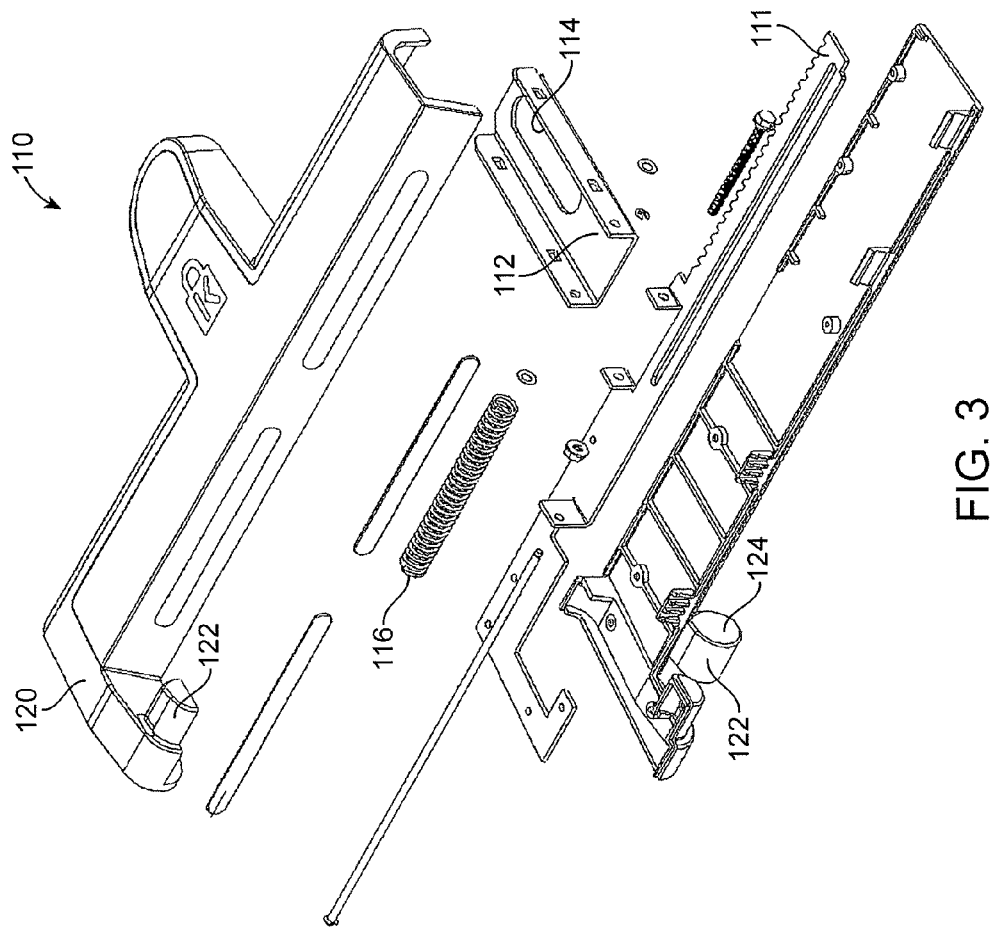
FIG. 3 is an exploded perspective view of a main body of an exemplary securing apparatus.
Figure 4:
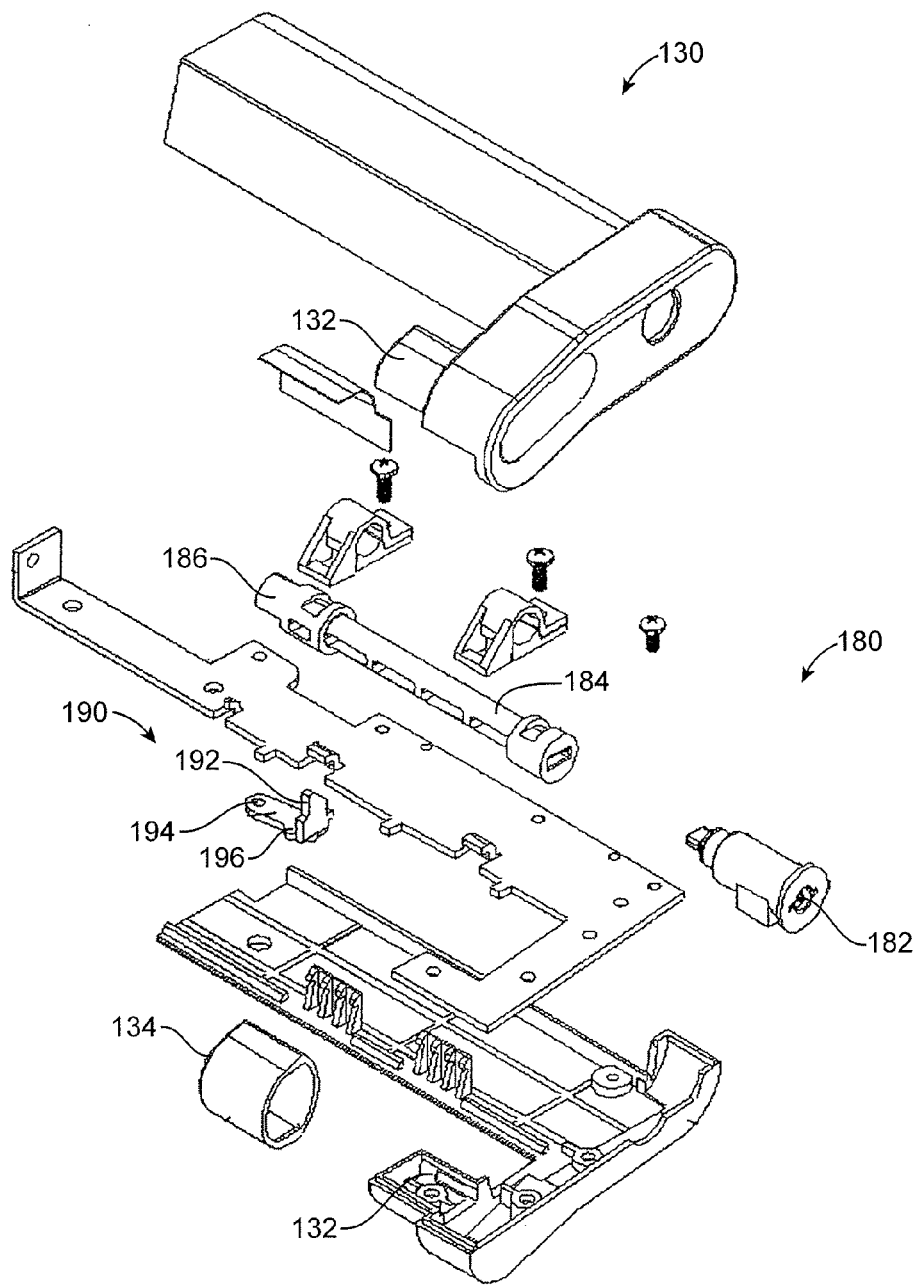
FIG. 4 is an exploded perspective view of a second arm and a locking system of an exemplary securing apparatus.

The term "ratchet arm" as used herein may refer to embodiments such as those illustrated in FIGS. 3-6, in which a tooth 196 of a pivotable ratchet latch 190 engages with a toothed bar 111 of the main body 110. Exploded perspective views of the main body 110 and second arm 130 are shown in FIGS. 3 and 4, respectively. FIGS. 5 and 6 show the engagement between the latch 190 and the toothed bar 111 as seen from below in FIGS. 3 and 4. FIG. 5 shows the ratchet latch 190 in its locked configuration, and FIG. 6 shows it in the unlocked configuration.

Figure 5A:
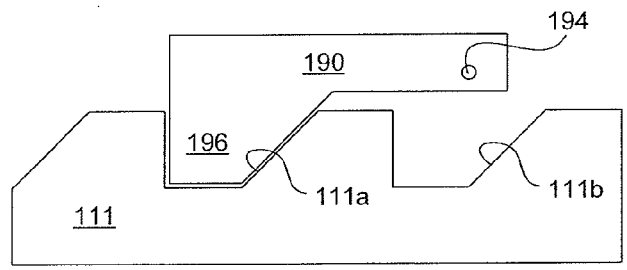
FIG. 5 is a schematic view of an exemplary ratchet latch in engagement with an exemplary toothed bar, in the locked state.
Figure 5B:
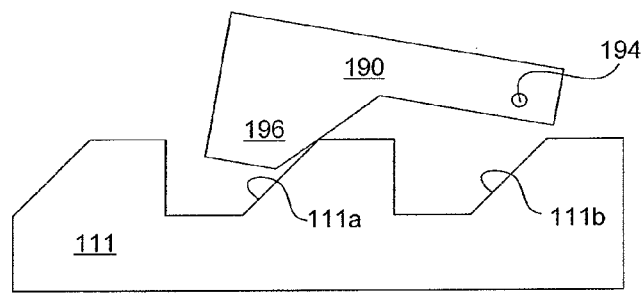
Figure 5C:
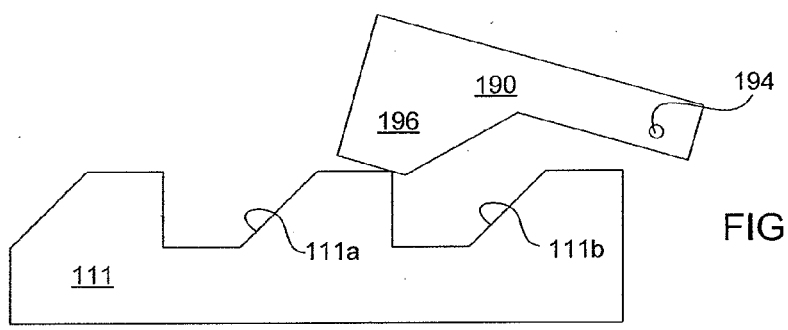
Figure 5D:
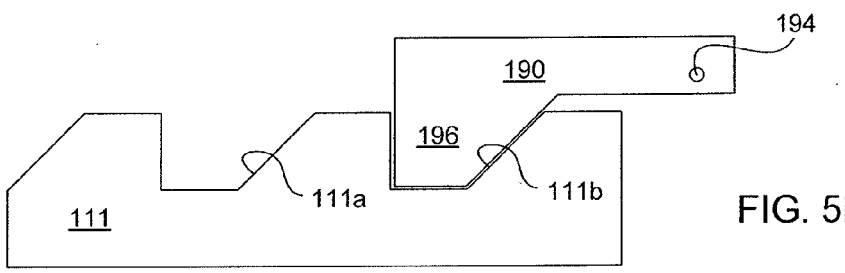
Figure 6A:
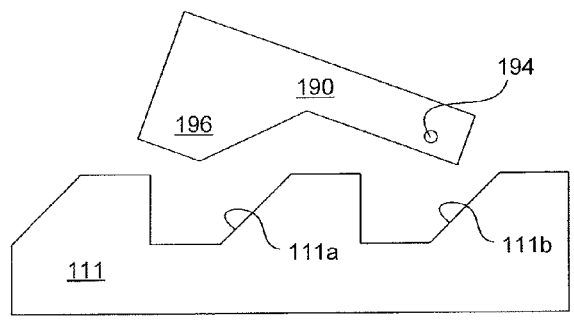
FIG. 6 is a schematic view of the ratchet latch and toothed bar of FIG. 5, in the unlocked state.
Figure 6B:
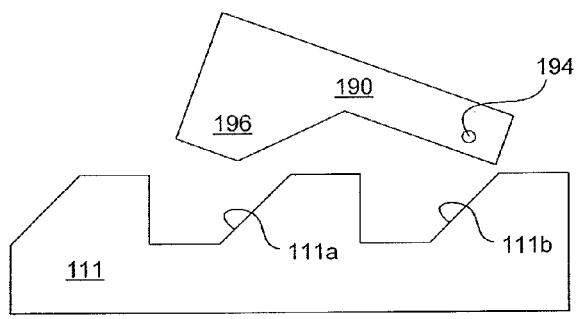
Figure 6C:
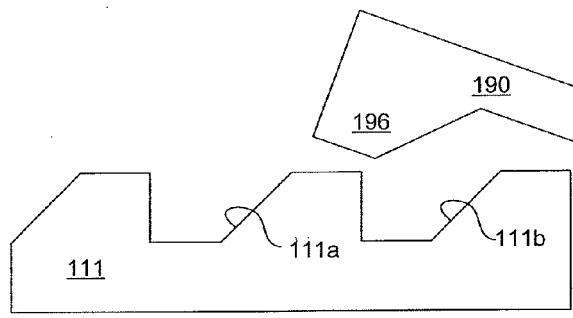
Figure 6D:
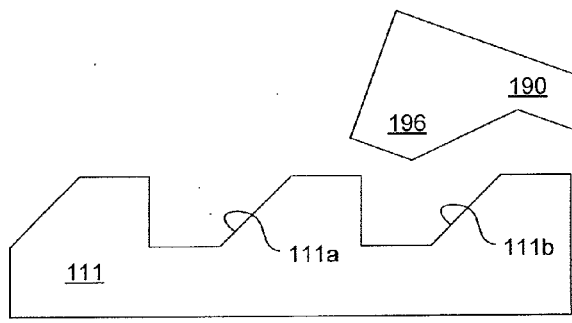

FIG. 4 illustrates an exemplary locking system 180 in its locked configuration. A cam surface 186 of an actuator bar 184 is clear of the ratchet latch 190, which is held against the toothed bar 111 (FIG. 3) by a ratchet latch return spring (not shown). Referring also to FIG. 5, in this locked configuration, when the ratchet arm 130 is pressed inwards (up and to the left in FIGS. 3 and 4; to the right in FIG. 5), the tooth 196 of the ratchet latch slides along the ramped teeth 111a, 111b of the toothed bar 111, pivoting the latch 190 about a pivot point 194 against the ratchet latch return spring. In more detail, starting from its rest position of FIG. 5A, the latch 190 is pushed right to the position of FIG. 5B, during which time the tooth 196 slides up the ramped tooth 111a, thus pivoting the latch 190 clockwise in FIG. 5 about the pivot point 194 and out of engagement with the tooth 111a. As it is pushed farther, as shown in FIG. 5C, the tooth 196 comes entirely out of engagement with the tooth 111a, and as it is pushed farther yet, as shown in FIG. 5D, it is snapped back into engagement with the next tooth 111b by the ratchet latch return spring. In this way, the ratchet arm 130 can be ratcheted closed along the toothed bar 111, but cannot be pulled open, because of the interference between the tooth 196 and the teeth 111a, 111b in the other direction (left in FIG. 5, down and to the right in FIGS. 3 and 4).

To unlock the apparatus, referring to FIG. 4, a user inserts a key (not shown) in the keyhole 182, and rotates it 180° clockwise, thus rotating the actuator bar 184 180° clockwise. The cam surface 186 of the actuator bar 184 engages a corresponding cam surface 192 of the ratchet latch 190, pivoting the ratchet latch 190 counterclockwise in FIG. 4 and out of engagement with the toothed bar 111. Referring also to FIG. 6, the ratchet latch 190 is held in this outwardly pivoted configuration by the cam surface 186 for the duration of the time that the apparatus is unlocked, leaving the ratchet arm 130 free to slide in either direction (open or closed) with respect to the toothed bar 111 without engaging with the teeth 111a, 111b. In some embodiments, when the apparatus is unlocked, a ratchet arm return spring 116 (see FIG. 3) opens the ratchet arm 130 to its full extended position.

While one exemplary ratcheting system has been shown and described, the invention is not limited thereto. For example and without limitation, the main body 110 may include one or more ratchet latches 190 and the arm 130 may include a toothed bar 111, or both the main body 110 and the arm 130 may include toothed bars that engage with each other. Alternatively, the arm 130 may slide freely to any continuous position within the main body 110, in any suitable manner. While the term "ratchet arm" is used throughout the specification for consistency, the claims should in no way be construed as being limited thereto.

Turning back to FIGS. 1 and 2, operation of an exemplary apparatus will now be described in more detail. If the device 200 to be secured is a laptop computer, the computer is first opened (i.e. the top, screen portion, or "lid" 210 of the computer is hinged open from the bottom, keyboard portion 220). The second arm 130 is then unlocked and slid, such as by the reverse sequential order shown in FIG. 6, to a substantially open position, either manually or by the ratchet arm return spring 116. A "substantially open position" refers to the second arm 130 being far enough down and to the right in FIGS. 1 and 2 (left in FIGS. 5 and 6) that the distance between the ends 124, 134 of the hooks 122, 132 is greater than the width of the laptop 200. The back of the laptop lid 210 is positioned against the front of the main body 110 (the surface located the farthest down and to the left in FIGS. 1 and 2) and the laptop 200 is slid up and to the left until the left edge 212 of the lid 210 abuts the first arm 120, thereby enclosing a small portion of the lid 210 between the first hook 122 and the first arm 120. The second arm 130 is then closed (slid up and to the left in FIGS. 1 and 2; to the right, in sequential order in FIG. 6) until it abuts the other edge 214 of the lid 210, enclosing another portion of the lid 210 between the second hook 132 and the second arm 130. The second arm 130 is then locked to this position, such as by the locking system 180 described above.

Alternatively, the locking system 180 is locked before closing the second arm 130, such as by placing the apparatus in the locked configuration shown in FIGS. 4 and 5, and then ratcheting the arm 130 closed, such as by the sequential order of FIG. 5. In embodiments which include a ratchet arm return spring 116, locking the ratchet arm 130 before closing it may assist in closing it against the return spring 116, but it should be appreciated that the ratcheting locked configuration such as that shown in FIG. 5 may also be used in embodiments which do not include a ratchet arm return spring 116.

It will be appreciated that in the closed configuration shown in FIG. 2B, as long as the laptop is prevented from being slid downward with respect to the main body 110 (by modes described later), that the laptop is secured to the main body and thus to the apparatus 100.

The device 200 to be secured may also be a monitor. This is deemed particularly useful for monitors of the type that are integrated with a computer processor, motherboard, hard disk, etc, in a housing the size and shape of a traditional monitor, but may also be used with traditional monitors. The device 200 may also be a tablet computer, or other similarly shaped device, that does not include a bottom section 220. To secure such a device, the second arm 130 is unlocked and slid to a substantially open position, so that the distance between the ends 124, 134 of the hooks 122, 132 is greater than the width of the device. The back of the device is positioned against the front of the main body 110 and the device is slid up and to the left in FIG. 2 until it is operatively encased between the hook 122 and the first arm 120. The second arm 130 is then closed until the other edge of the device is operatively encased between the second hook 132 and the second arm 130. The second arm 130 is then locked to this position. Alternatively, the second arm 130 is first locked, then closed. It will be appreciated that in this configuration, shown in FIG. 2B, if the device is prevented from being slid either upward or downward with respect to the main body 110 (by modes described later), that the device is secured to the main body, and thus to the securing apparatus 100.

Figure 2A:
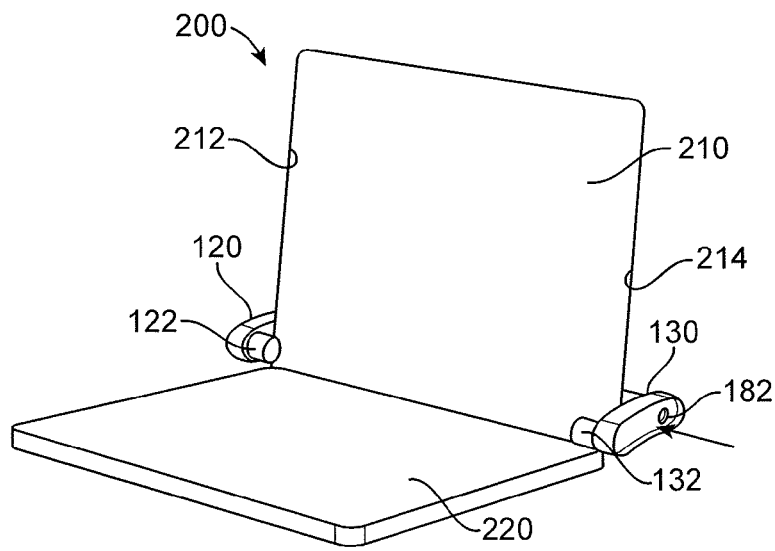
FIGS. 2A and 2B illustrate a method of use of an exemplary securing apparatus.
Figure 2B:
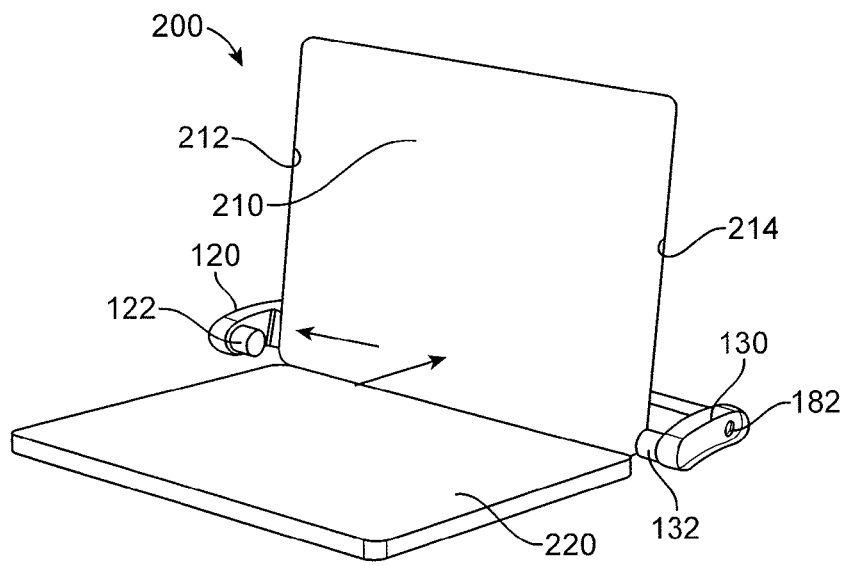

In the embodiment illustrated in FIGS. 1 and 2, only one of the arms 130 is a ratchet arm, but it should be appreciated that both arms 120, 130 may be ratchet arms. In some such embodiments, electronic devices with a wider variety of sizes can be enclosed by the securing apparatus 100. In some embodiments with two slidable ratchet arms 120, 130, two locking systems 180 are provided: one to each arm 120, 130, but other locking systems to secure a device between the arms 120, 130 are possible.

Securement of the Apparatus to a Location

Referring back to FIG. 1, methods of securing the apparatus 100 to a location, and methods of preventing the electronic device 200 from being slid vertically out of engagement with the main body 110, will now be described. It should be understood from the foregoing that, in the embodiment illustrated in FIG. 1, to secure a monitor, tablet computer, or other device without a bottom section 220, the device needs to be prevented from being slid either upward or downward and out of engagement with the hooks 122, 132. To secure a laptop, on the other hand, the laptop needs to be prevented only from being slid downward and out of engagement with the hooks. The structure of a laptop itself prevents it from being slid upward, as the lower section 220 of the laptop (the section including the keyboard, touchpad, etc) would interfere with the hooks 122, 132.

In some embodiments, the main body 110 is connected to a base section 140 and/or a device base 150. The base section 140 or device base 150 may be configured to be permanently attached to an object such as a desk or other work surface, such as with glue, wood screws, or any other suitable attachments. In some embodiments, the base section 140 or device base 150 has an attachment system, such as a cable 160, attached thereto. The cable 160 may, at its distal end not shown in the drawings, be configured to be locked to an immovable object, such as a piece of furniture, in any suitable manner. The attachment system 160 may additionally or alternatively include, for example, a chain, a monofilament, an optic cable that initiates an alarm or other indication, or a proximity detecting system that issues an alarm or other indication if objects are separated beyond a pre-established distance. Other mechanisms to prevent theft of the apparatus 100 and associated electronic device are within the scope of the claims. For example and without limitation, the main body 110 itself may be configured to be secured to a surface, or have an attachment system 160 attached thereto.

In some embodiments, a single securing apparatus 100 is compatible with many contemplated uses. For example, the apparatus 100 may be sold in modular faun, with the main body assembly 110 attached to the base section 140 as one module, and the device base 150 as another module, with associated screws or other attaching mechanisms provided separately. The cable 160 may also be provided separately. The end user can then assemble the apparatus 100 depending on the intended use.

For example, if the user wishes to secure a laptop computer, he or she can attach the base section 140 to the device base 150, making sure the cable 160 is secured therebetween, and lock the distal end of the cable 160 to an immovable object. Thus, the laptop computer is blocked from being slid downward out of engagement with the arms 120, 130 by the device base 150, and the apparatus 100 (and thus also the laptop) is kept at a location by the cable 160. Alternatively, the user can discard the device base 150 and cable 160, and affix the base section 140 directly to a work surface, such as a table or desk, with wood screws or the like. Thus, the laptop is blocked from being slid downward by the work surface, and the apparatus 100 (and thus also the laptop) is also affixed to its location on the work surface.

If the user wishes to secure a device that does not have a bottom section 220, he or she can discard the device base 150 and cable 160, and attach the base section 140 directly to a work surface. The device is thus blocked from being slid downward by the work surface, and the apparatus 100 is also affixed to its location on the work surface. To block the device from being slid upward and out of engagement with the main body 110, the securing apparatus 100 may be mounted under a securely fixed shelf or the like. Other methods of blocking the device from being slid upwards are within the scope of the claims. For example and without limitation, the main body 110 may have a third, vertically extending, ratcheting or fixed arm (not shown), with another hook on the end thereof to block the device from being slid upwards. Alternatively, the device base may be capable of being attached upside down to the main body 110 to block the device at the top.

The above-described user-settable modular configurations are given for purposes of example only, and are not to be construed as exhaustive or restrictive. In some further embodiments, for example, the main body 110 may be directly attached to a surface or an object, fixedly or with a cable, and additional shelves and work surfaces may be provided in any desired quantity and configuration. Still further, additional blocking elements, such as more than one device base 150, additional blocking plates, or ratcheting or fixed arms, may be provided integrally or modularly to the securing apparatus 100 to further secure the electronic device 200 from being slid out of engagement with the securing apparatus. Any method of blocking the electronic device 200 from being slid out of engagement with the main body is within the scope of the appended claims. Further, any method of securing the main body 110 to or near a location is within the scope of the appended claims.

Adjustability

In some embodiments, particularly, but not only, those which include a base section 140, the apparatus 100 may be adjustable in one or more degrees of freedom, as will now be described with reference to FIGS. 7-10. The term "adjustability" as used herein refers to user-settable configurations of the apparatus 100. For example, in some embodiments, the user can adjust the configuration, position, or orientation of the main body 110, such as adjusting its position or orientation with respect to the base section 140. These configurations can be selected by a user for a variety of reasons. One reason a user may wish to adjust the main body 110 would be to secure electronic devices of varying shapes or sizes (such as laptops with varying widths and/or varying thicknesses of the bottom section 220). Another reason would be to adjust the configuration, position, or orientation of the electronic device itself. For example, in some embodiments, the user can adjust the main body 110, along with the electronic device 200, with respect to the base section 140, such as to pivot the device 200 so the screen portion 210 is visible from a variety of angles, or to move the device 200 closer or farther away from the user. In some embodiments the user may wish to tilt the screen portion 210 of the device 200 with respect to the bottom section 220.

It should be readily appreciated that one aspect of this adjustability is effected by the slidable or ratcheting second arm 130: portable electronic devices 200 with a variety of widths can be secured by the apparatus, thanks to the sliding engagement of the second arm 130 with respect to the main body 110. Since this aspect of adjustability should be readily appreciated from the foregoing description, it will not be separately addressed under this heading.

Figure 7:
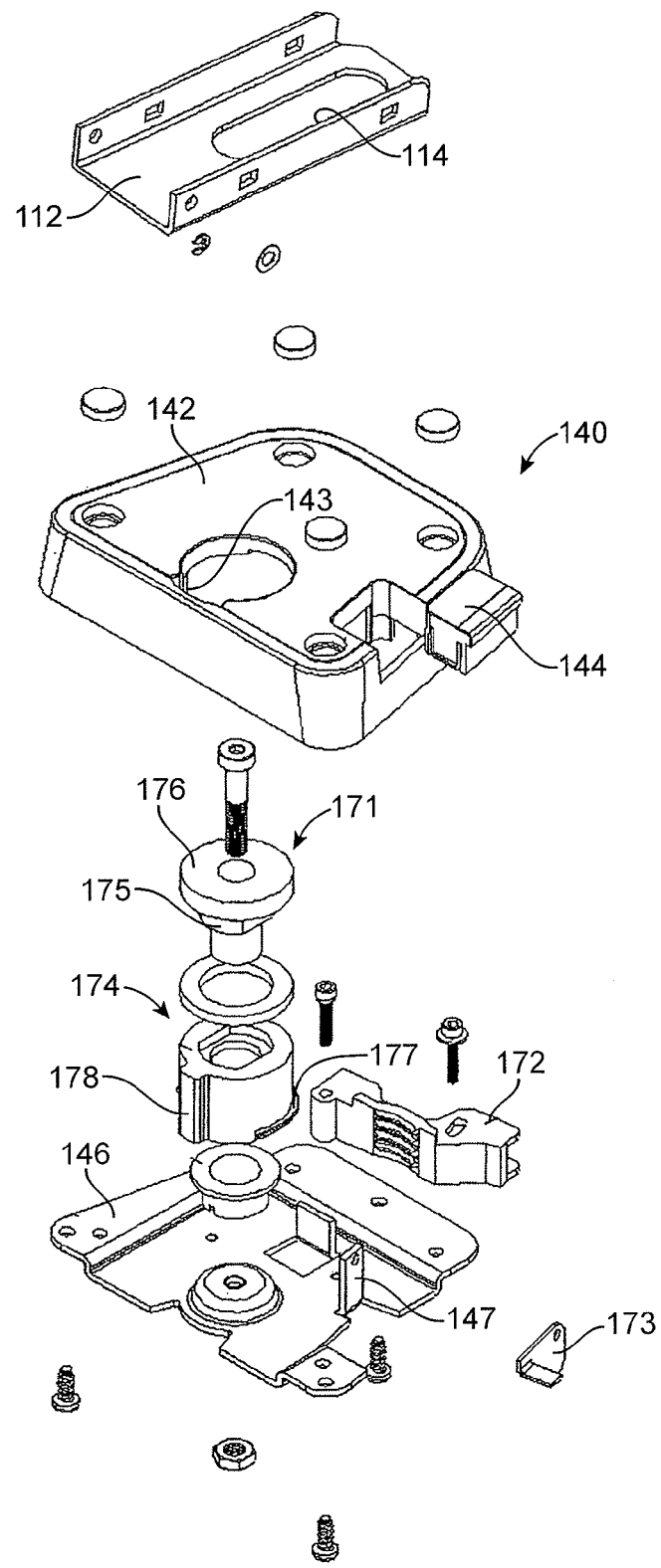
FIG. 7 is an exploded perspective view of a dozer plate of an exemplary main body, and an exemplary base section.

Turning to FIG. 7, in some embodiments, the main body 110 has a dozer plate 112 at its underside. The dozer plate 112 defines a slot 114 which engages with a collar assembly 170 of the base section 140 (see also FIG. 1).

This collar assembly 170 is partially housed in the base section 140 by a base cover 142 and a base plate 146. Part of the collar assembly 170 protrudes up from the base section 140, as best seen in FIG. 1. The base cover 142 also includes thereon a release lever 144.

Longitudinal Adjustability

Figure 8:
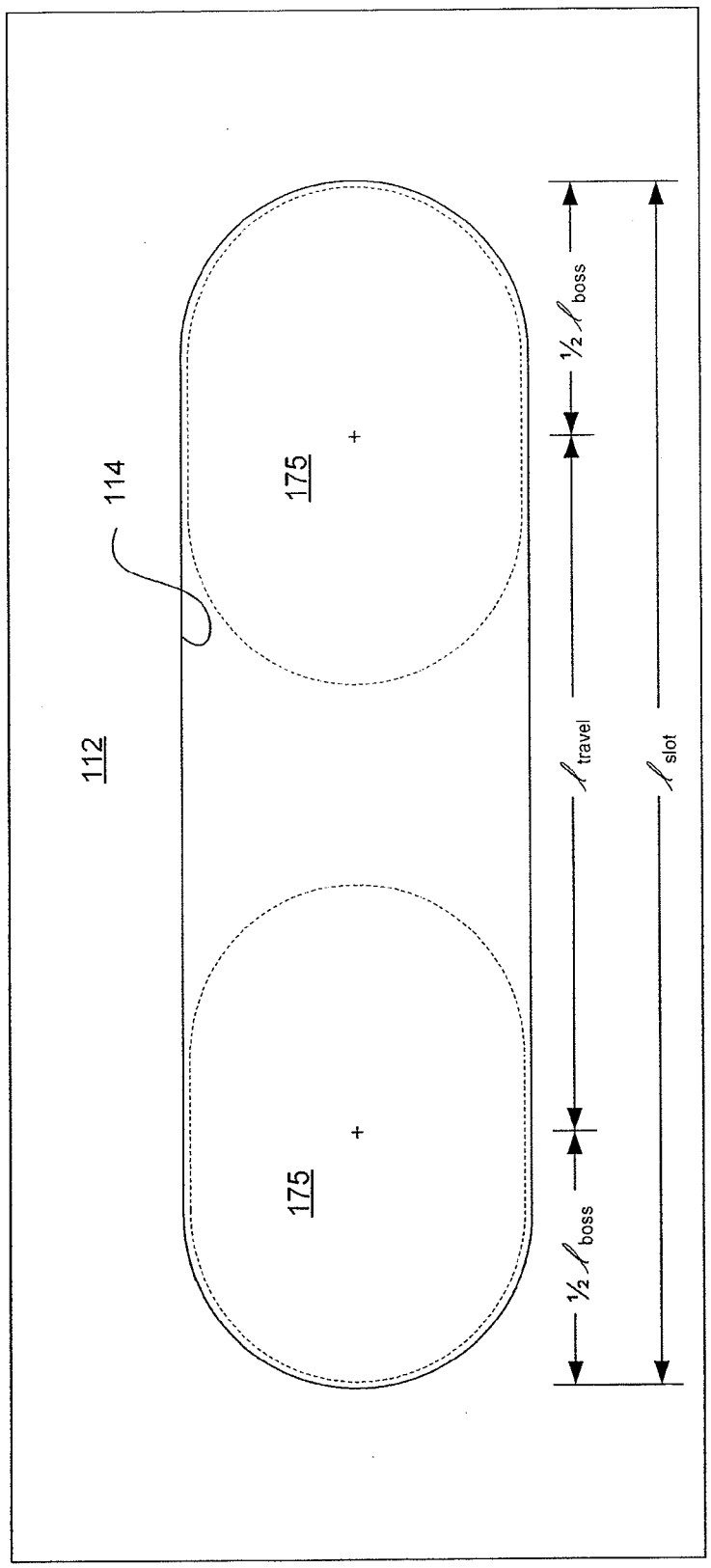
FIG. 8 is a schematic view illustrating longitudinal travel of an exemplary dozer plate with respect to an exemplary collar assembly.
Figure 9A:
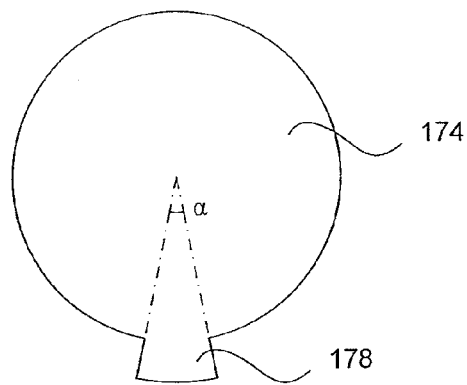
FIG. 9 is a schematic view illustrating pivotal travel of an exemplary collar assembly with respect to an exemplary base section.
Figure 9B:
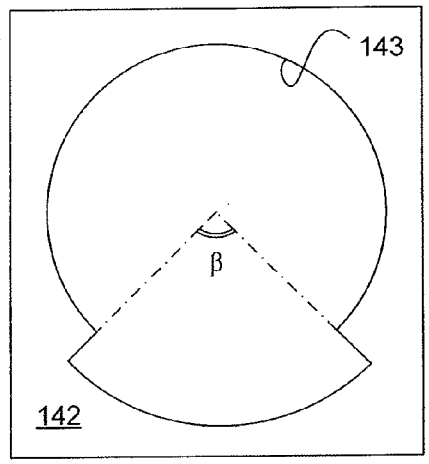
Figure 9C:
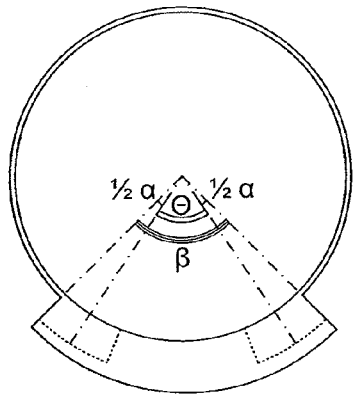

Referring to FIGS. 1, 7, and 8, in some embodiments, the slot 114 of the dozer plate 112 is engaged with a boss 175 of a collar top 171 of the collar assembly 170. The upper surface 176 of the collar top 171 may have a diameter that is larger than the width of the slot 114 of the dozer plate 112, so that the dozer plate 112, and thus the main body 110, is secured to the collar assembly 170, and thus the base section 140.

In some embodiments, this combination of slot 114 in dozer plate 112 along with collar assembly 170 allows the dozer plate 112 to move longitudinally (diagonally up and to the right, and down and to the left in FIGS. 1 and 7) with respect to the collar assembly 170. Specifically, referring also to FIG. 8, the dozer plate has a distance of travel $l_{travel}$ defined by the length of the slot $l_{slot}$ and the length of the boss $l_{boss}$:
$l_{travel} = l_{slot} - l_{boss}$.

The dozer plate 112 may be fixedly attached to the main body 110, and the collar assembly 170 may be attached in such a way that it is longitudinally stationary with respect to the base section 140. Therefore, the main body 110 has a longitudinal distance of travel $l_{travel}$ with respect to the base section 140. Because an electronic device 200 can be operatively encased by the main body 110, the electronic device 200 also has a longitudinal distance of travel $l_{travel}$ with respect to the base section 140.

This is particularly useful in applications where the base section 140 is fixed to a work surface, especially in public places where the electronic device 200 is used by a variety of users with varying arm lengths.

An exemplary value for $l_{travel}$ is around 40 mm, but the invention is not limited thereto.

Vertical Adjustability

Referring still to FIG. 7, in some embodiments, if a user pushes the release lever 144, the release lever 144 pushes downwards against a lever 173, which is pivotably attached to a bracket 147 on the base plate 146. The lever 173 pivots counterclockwise in FIG. 7, and pushes rightwards against a vertical lock 172. The vertical lock 172 then pivots counterclockwise in FIG. 7, which disengages the grooves in the vertical lock 172 from a step 177 on the bottom of the lock nut 174. The lock nut 174, and indeed the whole collar assembly 170, can now be raised or lowered until the user releases the release lever 144. In some embodiments, a collar assembly return spring (not shown) raises the collar assembly 170. Once the user releases the release lever 144, a vertical lock return spring (not shown) returns the vertical lock 172 and the lever 173 to their home positions, where the vertical lock 172 re-engages with the step 177 on the bottom of the lock nut 174.

In such an embodiment, the collar assembly 170 has a vertical travel h that is essentially equal to the distance between the topmost and bottommost grooves of the vertical lock 172. The collar assembly 170 may be attached in such a way that it is vertically stationary with respect to the main body 110, so the main body 110 has a vertical travel h with respect to the base section 140.

An exemplary value for h is 10 mm, but the invention is not limited thereto.

Thus, portable electronic devices 200 with varying thicknesses of the bottom section 220 can be secured by the apparatus 100. In uses in which a single user secures a single portable electronic device (such as in a home or office), the height of the main body 110 with respect to the base section 140 only needs to be adjusted once. If that user acquires a new electronic device 200 (or the apparatus 100 is assigned to a different user), then the height would be reset. This is considered especially useful in uses which include a device base 150 and cable 160, as the electronic device 200 can be securely squeezed between the hooks 120, 130 on one side, and the device base 150 on the other, so that the combination of the apparatus 100 and device 200 can be moved freely to varying positions, while being rigidly secured to one another.

Pivotal Adjustability

Still referring to FIG. 7, in some embodiments the lock nut 174 can be pivoted within the hole 143 of the base cover 142 through which the collar assembly 170 protrudes. The amount that the lock nut 174 can pivot is limited by a stopper 178 of the lock nut 174 in association with the shape of the hole 143. Specifically, referring to FIGS. 9A-9C, the amount Θ that the lock nut 174 can pivot is defined by the angle α that the stopper takes up in the lock nut, and the angle β of the groove in the hole 143: Θ=β−α. The collar assembly 170 may be attached in such a way that it is pivotally stationary with respect to the main body 110, so the main body 110, and thus any electronic device 200 encased therein, has a pivotal travel Θ with respect to the base section 140.

An exemplary value for Θ is 30°, but the invention is not limited thereto.

In some embodiments, pivotal adjustability can alternatively or in addition be effected by the dozer plate 112 being in pivotal engagement with respect to the collar assembly 170, such as by the boss 175 of FIGS. 7 and 8 being circular rather than having the illustrated shape. The dozer plate 112, along with the main body 110 and the electronic device 200, can thus pivot until the back of the electronic device 200 hits the base section 140. In this instance, the angle of travel Θ depends on the longitudinal position of the main body assembly 110 and electronic device 200: when the device 200 is slid all the way forward, there is more room for it to pivot without hitting the base section 140 than when it is slid all the way back.

Still further, the hole 143 can alternatively or additionally be circular, and the lock nut 174 may not include the stopper, so that Θ is not limited by the stopper, but only by the back of the device 200 hitting the base section 140.

Screen Tilt

Figure 10:
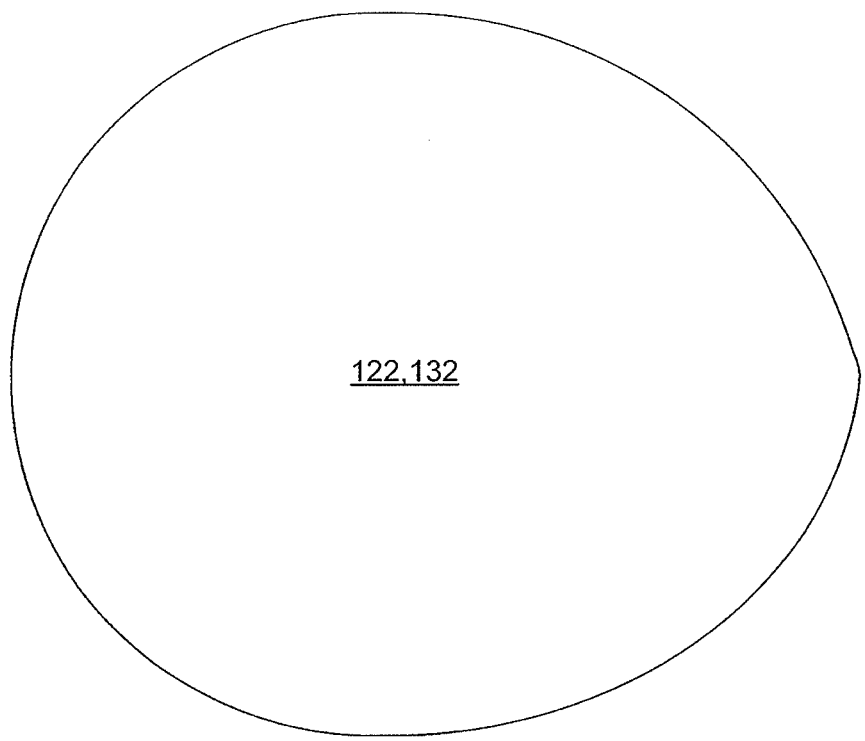
FIG. 10 shows a cross section of an exemplary hook.
Figure 11:
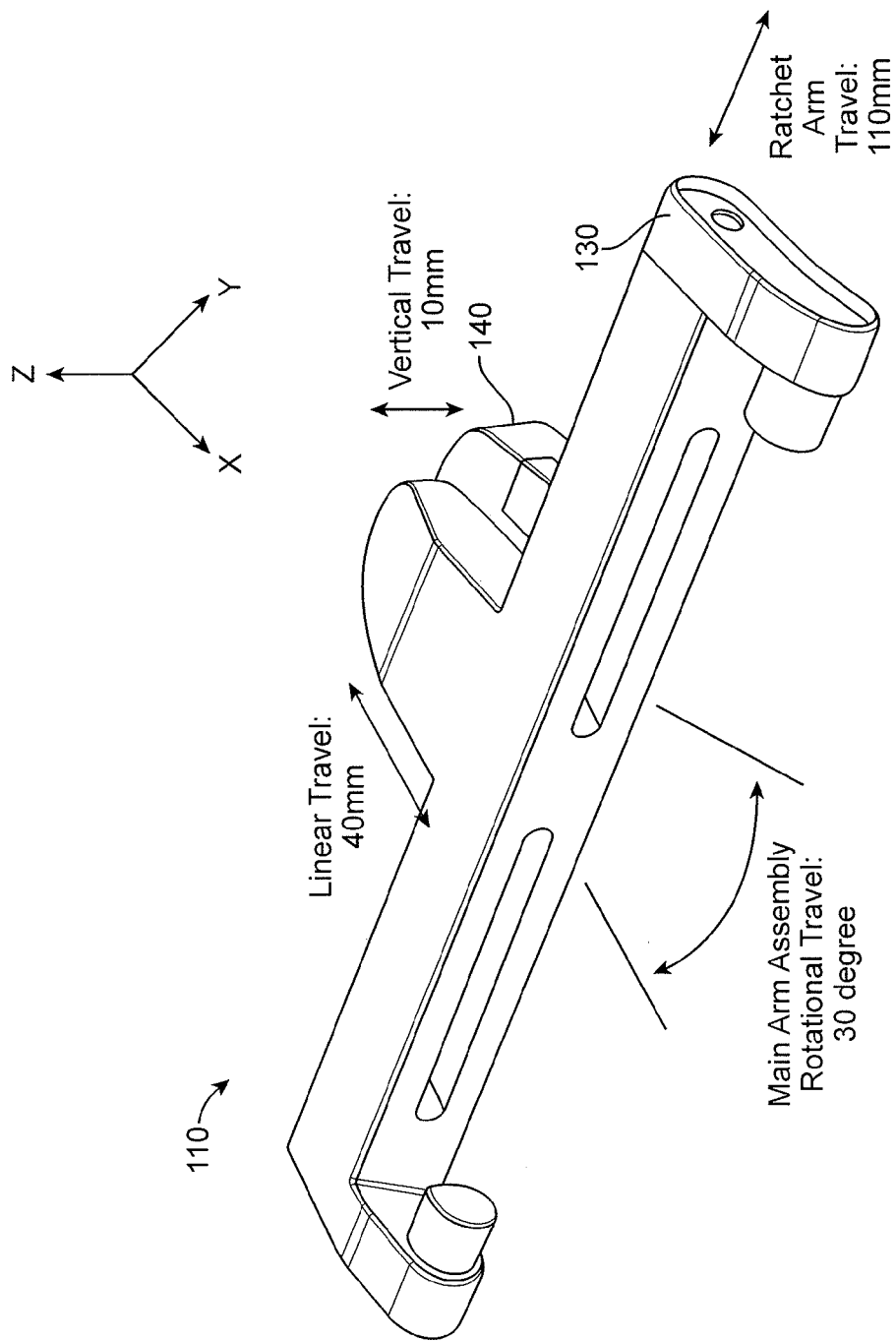
FIG. 11 is a schematic view illustrating the adjustability of an exemplary main body with respect to an exemplary base section.

In some embodiments, the hooks 122 and 132 have cross-sectional shapes such as that shown in FIG. 10, with the elongated section on the right of FIG. 10 facing the main body 110. In uses in which the electronic device 200 to be secured is a laptop computer, this allows the screen portion 210 to be tilted to any desired angle.

Advantages

As will be apparent from the foregoing description, the inventive securing apparatus provides several advantages over the securing apparatuses of the prior art. Some exemplary embodiments of the inventive apparatus can secure a portable electronic device rigidly, and thus more securely than a traditional cable lock inserted into a slot in a housing of the electronic device. Some embodiments allow the electronic device to be adjusted in one, two, three, or more degrees of freedom (such as longitudinally, vertically, and pivotably), while still rigidly securing it. This is particularly useful for public settings such as stores, libraries, and internet cafes, where several different users with different heights, arm lengths, etc. use the same electronic device.

Any recitation of "a", "an" or "the" is intended to mean "one or more" unless specifically indicated to the contrary.

The above description is illustrative and is not restrictive. Many variations of the disclosure will become apparent to those skilled in the art upon review of the disclosure. The scope of the disclosure should, therefore, be determined not with reference to the above description, but instead should be determined with reference to the pending claims along with their full scope or equivalents.

One or more features from any embodiment may be combined with one or more features of any other embodiment without departing from the scope of the disclosure.

All patents, patent applications, publications, and descriptions mentioned above are herein incorporated by reference in their entirety for all purposes. None is admitted to be prior art.

What is claimed is:

1. An apparatus for securing a portable electronic device, the apparatus comprising:
    a main body including a first end and a second end;
    a first arm disposed at the first end of the main body;
    a first hook attached to the first arm and configured to receive the portable electronic device between the first hook and the first arm;
    a second arm slidably disposed at the second end of the main body, the second arm being slidable to a plurality of lateral positions relative to the main body;
    a second hook attached to the second arm and configured to receive the portable electronic device between the second hook and the second arm; and
    a locking system coupled to the second arm, the locking system being movable between a locked configuration, in which the second arm is slidable toward the first arm and is inhibited from sliding away from the first arm, and an unlocked configuration, in which the second arm is slidable toward and away from the first arm;
    wherein the locking system includes a toothed bar coupled to one of the first arm and the second arm and a tooth coupled to the other of the first arm and the second arm, wherein the tooth engages the toothed bar when the locking system is in the locked configuration, and wherein the tooth disengages the toothed bar when the locking system is in the unlocked configuration;
    wherein the locking system further includes a pivotable ratchet latch that supports the tooth, and wherein the pivotable ratchet latch pivots out of engagement with the toothed bar when the locking system is in the unlocked position;
    wherein the locking system further includes an actuator bar having a first cam surface, wherein the pivotable ratchet latch includes a second cam surface, and wherein the first cam surface selectively engages the second cam surface to pivot the pivotable ratchet latch out of engagement with the toothed bar.

2. The apparatus of claim 1, wherein the actuator bar is rotatable to cause the first cam surface to engage the second cam surface.

3. The apparatus of claim 2, wherein the actuator bar includes a keyhole that is configured to receive a key to rotate the actuator bar.

4. The apparatus of claim 1, further comprising a biasing member coupled to the second arm, wherein the biasing member biases the second arm away from the first arm.

5. The apparatus of claim 1, further comprising a base section connected to the main body, wherein the base section is configured to support the apparatus on a work surface.

6. The apparatus of claim 5, wherein the main body is movable relative to the base section to change at least one of a position and an orientation of the portable electronic device relative to the work surface while the personal electronic device is secured between the first and second arms and the first and second hooks.

7. The apparatus of claim 6, wherein the main body is at least one of laterally movable, longitudinally movable, vertically movable, and rotationally movable relative to the base section to change the at least one of the position and the orientation of the portable electronic device relative to the work surface.

8. The apparatus of claim 5, further comprising a device base attached to the base section, wherein the device base is configured for the portable electronic device to rest thereon when the electronic device is received between the first and second arms and the first and second hooks.

9. The apparatus of claim 8, further comprising a cable extending from the device base and configured to be secured to an immovable object.

10. The apparatus of claim 5, wherein the base section is configured to be permanently attached to the work surface.

\* \* \* \* \*